United States Patent [19]
Hayashi et al.

[11] Patent Number: 5,047,090
[45] Date of Patent: Sep. 10, 1991

[54] SEMICONDUCTOR DEVICE

[75] Inventors: Yutaka Hayashi, Tsukuba; Shigeaki Tomonari, Kadoma; Jun Sakai; Keizi Kakite, both of Kadoma, all of Japan

[73] Assignees: Agency of Industrial Science & Technology, Ibaragi; Matsushita Electric Works, Ltd., Osaka, both of Japan

[21] Appl. No.: 480,203

[22] Filed: Feb. 14, 1990

[30] Foreign Application Priority Data

Feb. 23, 1989 [JP] Japan .................. 1-44123

[51] Int. Cl.⁵ ........................... H01L 31/06
[52] U.S. Cl. ..................... 136/249; 136/291; 136/293; 250/551; 307/311
[58] Field of Search ........... 136/249 TJ, 291, 293; 250/551; 307/311

[56] References Cited

U.S. PATENT DOCUMENTS

| | | | |
|---|---|---|---|
| 4,271,328 | 6/1981 | Hamakawa et al. | 136/249 TJ |
| 4,320,247 | 3/1982 | Gatos et al. | 136/255 |
| 4,376,228 | 3/1983 | Fan et al. | 136/255 |
| 4,400,221 | 8/1983 | Rahilly | 437/17 |
| 4,916,323 | 4/1990 | Hayashi et al. | 250/551 |

Primary Examiner—Aaron Weisstuch
Attorney, Agent, or Firm—Burns, Doane, Swecker & Mathis

[57] ABSTRACT

A semiconductor device includes laminated photoelectric conversion elements each having a semiconductor thin film carrying out the photoelectric conversion, the respective semiconductor thin film having a relationship $L \leq 1/\alpha(\lambda)$ when incident light is of a wavelength $\lambda$, the semiconductor thin film is of an absorbtion coefficient $\alpha(\lambda)$ with respect to the light of the wavelength $\lambda$ and the carrier collecting length is L, whereby the optimum combination of the incident light wavelength and the sensitivity of the device can be obtained to realize a high photoelectric conversion efficiency.

10 Claims, 9 Drawing Sheets

SEMICONDUCTOR DEVICE

BACKGROUND OF THE INVENTION

1. Field of the Invention

This invention relates to a semiconductor device in which semiconductor thin films carry out a photoelectric conversion of incident light, so as to generate an electric power.

The semiconductor device of the type referred to can be effectively utilized in optical control circuits and the like.

2. Description of the Related Art

Hitherto, there have been suggested various types of the semiconductor devices of the kind referred to as being applicable to optical control circuits.

For example, the present inventors have already disclosed in earlier U.S. Pat. No. 4,916,323 a switching device comprising semiconductor devices formed as an array of photoelectric conversion elements and connected to the gate of a field effect transistor (which shall be referred to as "FET" hereinafter) or the like as a switching element. This switching device also includes a light emitting element, the light from which element is received by the array of the photoelectric conversion elements to generate electric power, and the FET or the like is caused by this electric power to perform a switching operation. In order that, in this case, the FET or the like as a voltage controlled element is driven, it is normally required that a plurality of the photoelectric conversion elements be connected in series to generate a voltage exceeding a threshold voltage across the source and gate of the FET or the like. For the series connection of these photoelectric conversion elements, they are to be first formed respectively in an island shape as mutually separated elements and then connected to each other through a conductive thin film. According to the arrangement of this earlier invention, there can be attained various advantages, e.g., the switching device can be provided at a lower cost and higher in utility than when the photoelectric conversion elements are formed on the respective separated islands on a dielectric isolation substrate as has been earlier practiced, if an array of the photoelectric conversion elements can be formed directly on a semiconductor substrate on which FET's and the like are formed so as to allow the device to be formed from one chip, and so on.

Further, in U.S. Pat. No. 4,400,221, there is disclosed an arrangement which permits a photovoltaic force to be generated by a solar battery with a light emitting diode used as a light source. Further, U.S. Pat. No. 4,320,247 discloses a semiconductor device comprising a lamination of seven pn layers.

In the semiconductor devices of the kind referred to, on the other hand, there has been a tendency that, while generally a thicker semiconductive film causes incident light to be sufficiently absorbed but charge carriers are collected insufficiently, a thinner semiconductive film causes the carrier collection to be sufficient but the light absorption to be insufficient, and it has been thus required to optimally combine the sensitivity of the semiconductor device with the wavelength of light from the light emitting element so as to attain a high photoelectric conversion efficiency. However, this requirement has not been sufficiently realized by the foregoing prior art.

SUMMARY OF THE INVENTION

A primary object of the present invention is, therefore, to provide a semiconductor device the sensitivity of which is combined extremely well with the wavelength of incident light to the device so as to realize a high photoelectric conversion efficiency, while still keeping a high freedom of designing the device structure.

According to the present invention, this object can be attained by a semiconductor device comprising laminated photoelectric conversion elements respectively having a semiconductor thin film carrying out a photoelectric conversion to generate electric power, wherein the semiconductor thin film has a relationship $L \leq 1/\alpha(\lambda)$ when incident light is of a wavelength $\lambda$, the semiconductor thin film has an absorption coefficient $\alpha(\lambda)$ with respect to the light of the wavelength $\lambda$ and the carrier collecting length is L.

Other objects and advantages of the present invention shall be made clear in the following detailed description with reference to embodiments shown in the accompanying drawings.

While the present invention shall now be explained with reference to the embodiments shown in the accompanying drawings, it should be appreciated that the intention is not to limit the invention only to these embodiments shown but rather to include all alterations, modifications and equivalent arrangements possible within the scope of the appended claims.

DETAILED DESCRIPTION OF THE PREFERRED EMBODIMENTS

Figure 1:
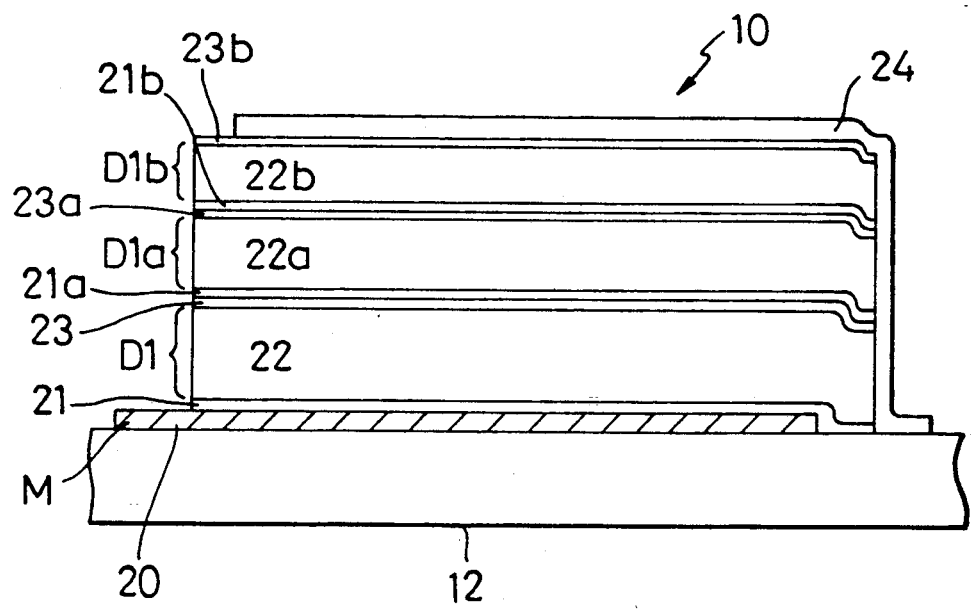
FIG. 1 shows a cross section of an embodiment of the semiconductor device according to the present invention.

Referring to FIG. 1, there is shown a first embodiment of the semiconductor device according to the present invention and forming a light receiving element. This light receiving element 10 is formed with a lamination of two or more layers (three layers are shown for convenience in the drawing) of photoelectric conversion elements each including a semiconductor thin film having a relationship $L \leq 1/\alpha(\lambda)$ in which L denotes the carrier collection length, $\lambda$ denotes the wavelength of incident light and $\alpha(\lambda)$ represents the light absorption coefficient of the semiconductor thin film with respect to the light of the wavelength $\lambda$. It is desirable that the number of photoelectric conversion elements to be laminated is more than $1/[\alpha(\lambda) \cdot L]$.

In the semiconductor device 10, more specifically, an electrically conductive thin film 20 preferably of Ni-Cr, Al or the like is first formed on a surface of an insulating substrate 12, and then the photoelectric conversion elements D1, D1a, D1b, ... each made of an amorphous silicon and satisfying the relationship $L \leq 1/\alpha(\lambda)$ are laminated on the conductive thin film 20. That is, a first conductivity type (for example, p-type) semiconductor layer 21, a semiconductor layer 22 (of, for example, i-type) relatively low in concentration of valency controlling impurities and forming a semiconductor thin film capable of carrying out the photoelectric conversion, and a second (i.e., opposite) conductivity type (for example, n-type) semiconductor layer 23 are laminated sequentially in the order described, and the first photoelectric conversion element D1 is thereby formed. Next, the second photoelectric conversion element D1a is formed on the first element D1 with the same semiconductor layers laminated in the same order as in the first element D1, and then the third photoelectric conversion element D1b is formed on the second element D1a with the same semiconductor layers laminated in the same order as in the first and second elements D1 and D1a. Any desired number of the photoelectric conversion elements may be thus formed by repeating the lamination of the same semiconductor layers in the same order as above, while the device is shown in the drawing with only three photoelectric conversion elements for purposes of simplification. After the formation of the topmost photoelectric conversion element, a light-transmitting conductive thin film 24 of, for example, $In_2O_3$ is formed on the top surface, and the light receiving element 10 is thus provided. In this case, the first conductivity type semiconductor layers 21, 21a, 21b... and the second conductivity type semiconductor layers 23, 23a, 23b... may not be required to be formed of a material which absorbs the light of the wavelength $\lambda$, but may be formed by, for example, an amorphous SiC or a microcrystalline Si.

Figure 2:
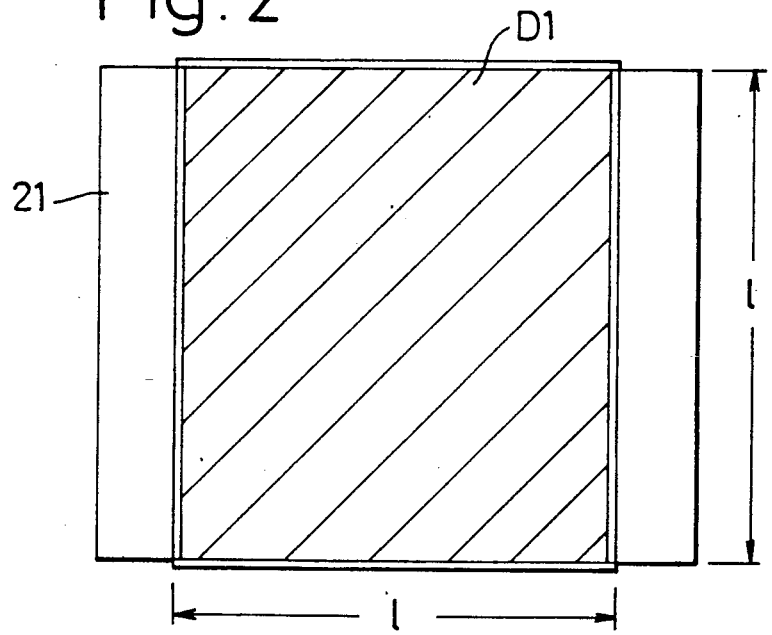
FIG. 2 is a plan view of the device in FIG. 1.

In driving a voltage controlled element such as a FET or the like which forms a switching element, on the other hand, it is necessary to connect in series a plurality of the photoelectric conversion elements so as to obtain a voltage exceeding the threshold voltage across the source and gate of FET or the like. When the photoelectric conversion elements are formed as mutually separated islands and are connected in series through a conductive thin film as is the known device, however, there arises a problem that the clearance space between adjacent islands becomes a dead space where no electric power is generated. The clearance in extreme cases reaches about 20% of the entire light receiving surface so as to significantly lower the photoelectric conversion efficiency. In contrast, in the light receiving element 10 according to the present invention, the first, second, third ... photoelectric conversion elements D1, D1a, D1b ... are provided in a form where these elements are connected in series between the lowermost and topmost conductive thin films 20 and 24 and, as will be clear from FIG. 2, the element 10 involves no substantial dead space, so that the photoelectric conversion efficiency can be sufficiently improved. In the arrangement of the present embodiment, although the topmost conductive thin film 24 is extended down along one end surface of the respective photoelectric conversion elements D1, D1a, D1b to contact directly therewith at inner surface of the film 24, there arises little parallel connection loss between them because of the large sheet resistance nature of the thin films 21, 22, 23, 21a, 22a, 23a, 21b, 22b, 23b..., as is the case with amorphous films and results in no electrochemical action such as electrolytic corrosion and the like which was observed on a metal interconnected conventional array, and thus is improved in reliability.

Figure 5:
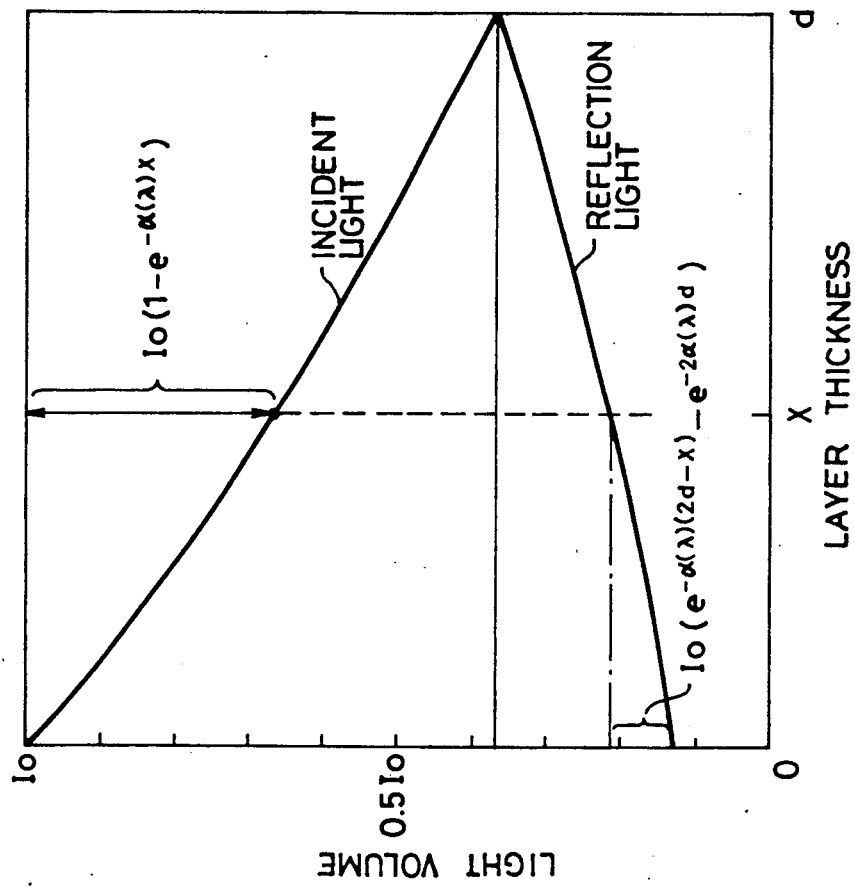
FIG. 5 is a diagram representing light absorption at a region of the photoelectric conversion element in the device of FIG. 1.
Figure 3:
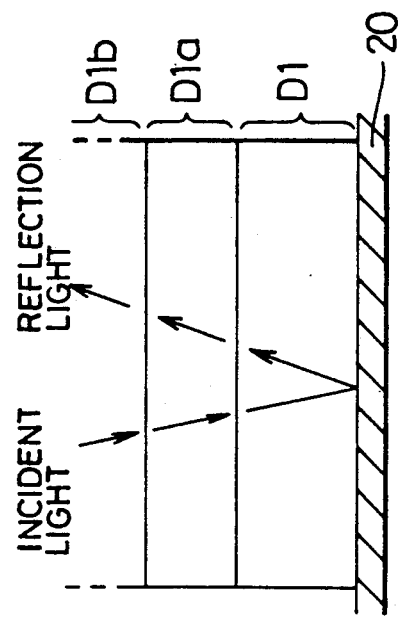
FIG. 3 is an explanatory view for the operation of the device shown in FIG. 1.

Explaining further the desirable design of the structure of the light receiving element 10, it should be assumed here that the incident light to the element 10 is caused to be completely reflected by the lowermost conductive thin film 20 as shown in FIG. 3 and this reflected light also contributes to the generation of electric power as shown in FIG. 5. The light absorption at a position within the element 10 separated by a distance x from its top surface is given for incident light: $Io(1 - e^{-\alpha\lambda \cdot x})$ and for reflected light: $Io(e^{-\alpha(\lambda)(2d-x)} - e^{-2\alpha(\lambda) \cdot d})$ wherein Io is the intensity of the incident light, and d is the total thickness of the semiconductor thin films which are laminated to carry out the photoelectric conversion. In this case, the light absorption at the first and second conductivity type semiconductor layers is considered to be negligible since their optical thicknesses are designed to be very small.

Figure 4:
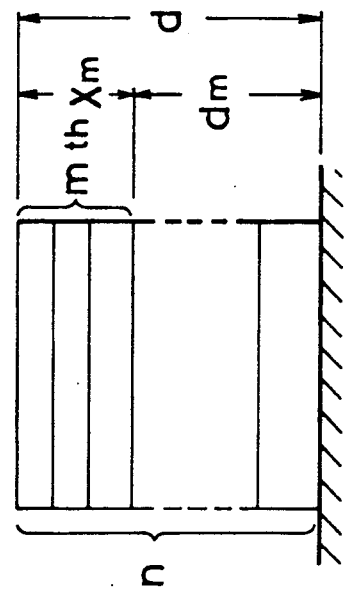
FIG. 4 is a schematic explanatory view for the semiconductor thin film in the device of FIG. 1.

Assuming further that, as in FIG. 4, the number of the lamination photoelectric conversion elements is n and the integrated thickness of the semiconductor thin films from the top surface to the m-th one of the elements ($m \leq n$) is Xm, then the light volume Im absorbed first between the top surface and the depth Xm will be $$Im = Io(1 - e^{-\alpha(\lambda) \cdot Xm}) + Io[e^{-\alpha(\lambda) \cdot (2d - Xm)} - e^{-2d(\lambda) \cdot d}] \quad \ldots (1)$$

Next, the light volume It absorbed by the entire lamination of the photoelectric conversion elements D1, D1a, D1b ... will be $$It = Io(1 - e^{-2\alpha(\lambda) \cdot d}) \quad \ldots (2)$$

When the light volume absorbed in the respective n photoelectric conversion elements is made equal to each other, then $$Im = (m/n)It = (m/n)Io(1 - e^{-2\alpha(\lambda) \cdot d}) \quad \ldots (3)$$

Accordingly, in the relationship to the above formulas (1) and (3), $$Io(1 - e^{-\alpha(\lambda) \cdot Xm}) + Io(e^{-\alpha(\lambda) \cdot (2d - Xm)} - e^{-2\alpha(\lambda) \cdot d})$$
$$= (m/n)Io(1 - e^{-\alpha(\lambda) \cdot d}) \quad \ldots (4)$$

From this formula (4), a relationship (dm=d−Xm) of $$d - Xm = [1/\alpha(\lambda)] \sin h^{-1}[\{1-(m/n)\} \sin h \cdot \alpha(\lambda) \cdot d] \quad \ldots (5)$$

is obtained. With this formula (5), the wavelength λ of the incident light, the light absorption coefficient α(λ) of the semiconductor thin films, and the number n of the laminated photoelectric conversion elements are determined and the photoelectric conversion element according to the present invention can be properly designed. As will be clear from later described concrete examples, the thickness of the respective semiconductor thin films determined by the formula (5) involves no remarkable variation, and such variation by about 10% results in no remarkable change in respective characteristics. In this case, the thickness of the semiconductor thin films carrying out the photoelectric conversion should preferably satisfy the condition that their thickness be smaller than the carrier collection length L. In particular, the semiconductor thin film which carries out the photoelectric conversion in the lowermost photoelectric conversion element is the thickest, it is optimum that the formula $$d - Xn = \text{l(film thick. of the lowermost photoelec. conv. elem.)} \quad (6)$$
$$= \{1/\alpha(\lambda)\}\sin h^{-1} \cdot \{(1/n)\sin h \cdot \alpha(\lambda) \cdot d\} < L$$

be satisfied.

Figure 6:
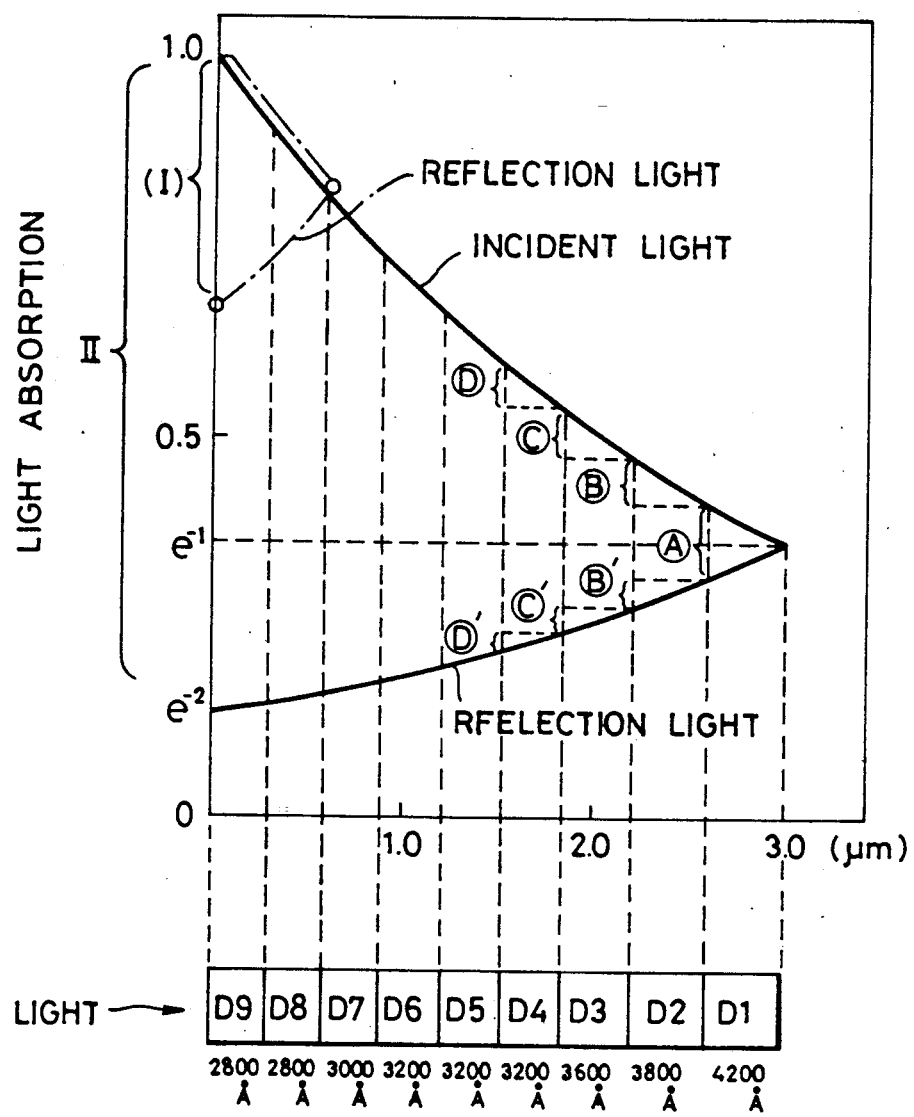
FIG. 6 is a diagram representing the light absorption at a region of the photoelectric conversion elements of nine laminated layers in the device of FIG. 1.

Referring more specifically to the structure of the light receiving element according to the present invention, with reference to a light receiving element formed with the photoelectric conversion elements of an amorphous silicon which receives an emitted light from an LED with, for example, 6600 Å wavelength, nine photoelectric conversion elements D1–D9 are laminated as is shown in FIG. 6, in which the thickness of the respective photoelectric conversion elements is shown. As also shown in FIG. 6, it is required that the total film thickness be about 3 μm for absorbing the light with wavelength of 6600 Å with the amorphous silicon. Since the film thickness of the photoelectric conversion element of ordinary amorphous silicon is about 6000 Å, the light volume which can be absorbed with this film thickness is as shown by a single-dot chain line in FIG. 6, which is substantially about one third of that absorbed with the thickness of 3 μm as shown by a solid line curve in the drawing. In this case, the absorption A=B+B'=C+C'=D+D'=....

Here, it has been found that the light with wavelength of 6600 Å can be absorbed substantially completely within a 3 μm thick amorphous film, considering internal reflection of the light, and electric power can be efficiently generated by the present device when the film thickness of the respective photoelectric conversion elements D1–D9 is so designed that the total amorphous silicon film thickness of 3 μm is divided into nine parts in accordance with the above formula (5), wherein the thickness of the respective photoelectric conversion elements is in a range of about 3000–4000 Å, that is, a thickness substantially one half of that required in the known ordinary single element will suffice. Since the film thickness of the respective photoelectric conversion elements can be thus reduced, it is possible to improve the device remarkably with respect to the deterioration in the conversion efficiency due to the small value of the carrier collection length L (smaller than 3 μm) or the photo-induced degradation peculiar to amorphous silicon. According to the arrangement of the present invention, therefore, the photoelectric conversion efficiency to which the wavelength λ, light absorption coefficient α(λ) and carrier collection length L are primarily determinative can be remarkably improved.

Figure 7:
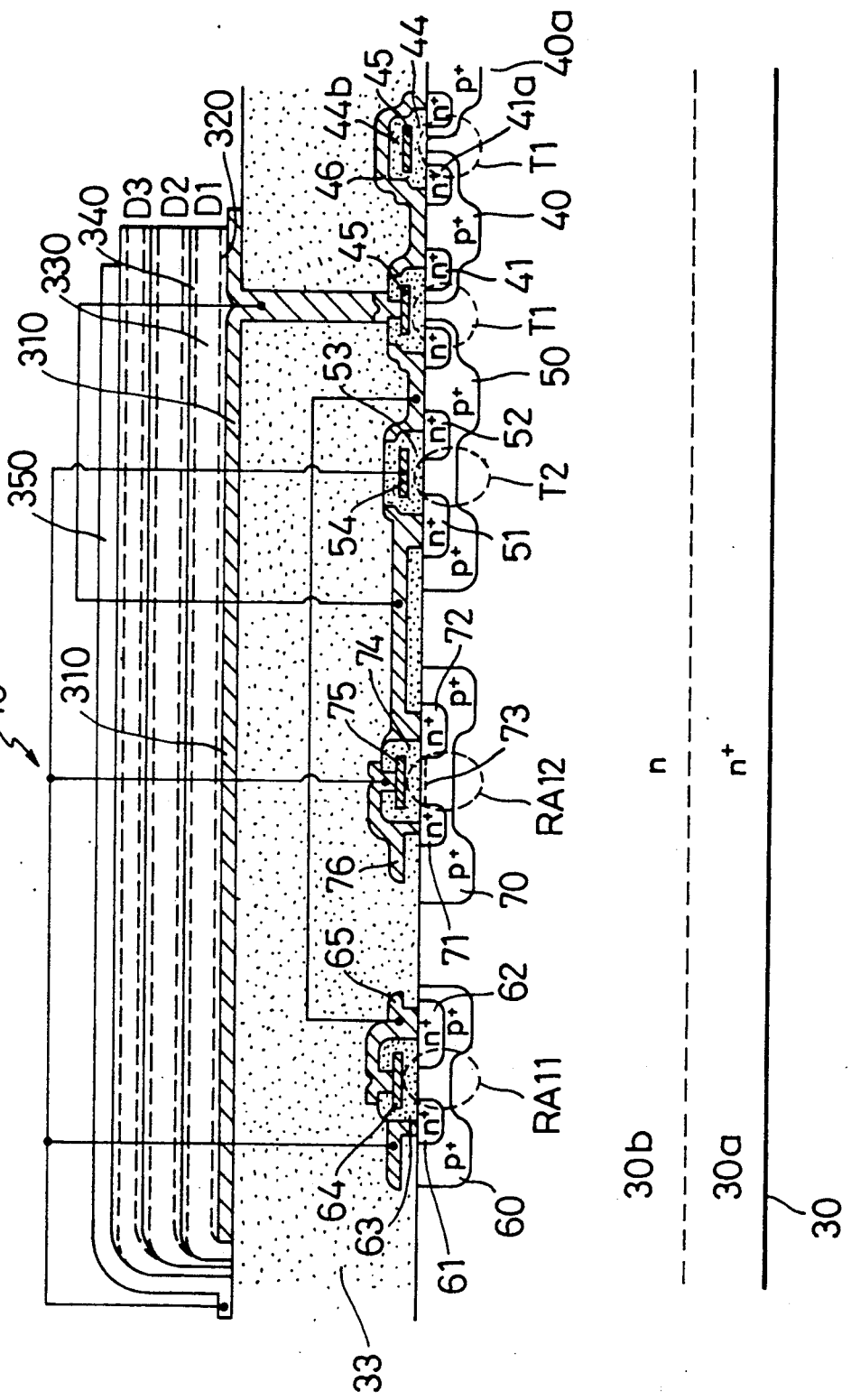
FIG. 7 shows a cross section a switching device in which the semiconductor device of the present invention is employed in another embodiment.
Figure 8:
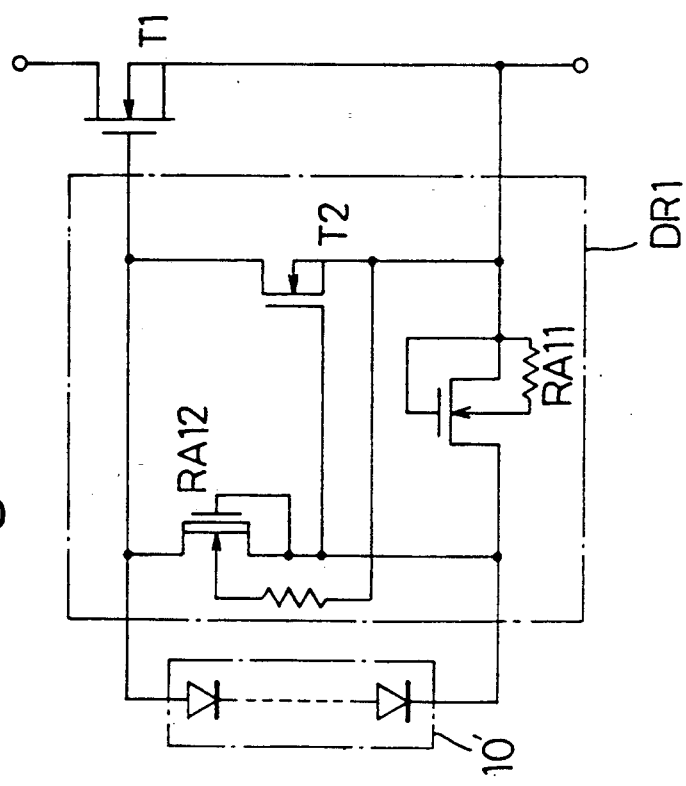
FIG. 8 is a circuit diagram equivalent of the switching device of FIG. 7.

Referring now to FIG. 7, there is shown a switching device in which the light receiving element formed according to the present invention is employed as a light receiving section, and an equivalent circuit arrangement of the above switching device is shown in FIG. 8. More specifically, the switching device shown here comprises the light receiving element 10', an FET T1 forming a switching element, and a control circuit DR1 which includes an FET T2 and first and second resistive element RA11 and RA12.

The light receiving element 10' of the present embodiment is laminated on a semiconductor substrate 30 provided with the FET T1 and control circuit DR1, the former transistor T1 of which is, more specifically, to be of such structure as described in the following. That is, the semiconductor substrate 30 of a second conductivity type is made to have a low resistivity zone 30a of second conductivity type (e.g., n+-type) and a high resistivity zone 30b of second conductivity type (e.g., n-type), and a plurality of first conductivity type, i.e., p-type layers 40, 40a . . . and 50 are formed on a surface of the side of the high resistivity zone 30b, separated from each other. On the surface of the respective p-type layers 40, 40a . . . and 50, further, there are formed second conductivity type zones, n+-type layers 41, 41a . . . . It will be appreciated here that these n+ layers 41, 41a . . . are connected at their portions other than those shown in a cross section of FIG. 7.

On the surface of the semiconductor substrate 30 having the respective layers formed as in the above, electrodes 45 of polysilicon or the like are formed on an insulating film 44 so that each electrode 45 will be disposed across two adjacent p-type layers 40, 40a . . . and 50, and a plurality of the FET's T1 of double diffusion type are formed with the electrodes 45 made as insulated gates G, n+-type layers 41 as sources S, portions of the n-type semiconductor substrate 30 around the respective p layers 40, 40a . . . as drains D and surface portions of the p layers 40, 40a . . . and 50 disposed between the n+-type layers 41 and n-type semiconductor substrate 30 as channel-forming zones. On the top surface of the respective electrodes 45, an insulating film acting also as a protecting film is formed, and a conducting thin film 46 of Al or the like is formed between the respective FET's T1. This conducting thin film 46 is in contact with the respective N+-type layers 41, 41a . . . and respective p-type layers 40 used as a source electrode. The respective electrodes 45 are mutually connected at portions other than those shown in the cross section of the drawing, and the drains D of the respective FET's T1 which are the portions of the semiconductor substrate 30 are thus also mutually connected electrically, so that the respective FET's are in mutually parallel connected relationship.

Next, the FET T2 in the control circuit DR1 shall be detailed. That is, a p-type layer 50 of the first conductivity type is provided also in the surface of the side of the high resistivity zone 30b of the second conductivity type semiconductor substrate 30, and mutually separated n+-type layers 51 and 52 of the second conductivity type zone are formed in the p-type layers 50. Further, the semiconductor substrate 30 having the respective zones formed as in the above is provided with an electrode 54 of polysilicon or the like formed on an insulating film 53 so as to ride across the n+-type layers 51 and 52, and a transistor forming the FET T2 is formed with the electrode 54 made as an insulated gate G, the n+-type layers 51 and 52 as the source or drain D (in the drawing, the n+-type layer 52 is made as the source and the other n+-type layer 51 as the drain) and a surface portion of the p-type layer disposed between both n+-type layers 51 and 52 as a channel forming zone.

While in the above described structure the transistor T2 is formed in the first conductivity type zone 50 common with the foregoing transistor T1, the transistor T2 may be formed in some other first conductivity type zone spaced apart from the zone 50. Further, the elements for the control circuit may be formed by utilizing a second conductivity type zone formed in the first conductivity type zone. Further, it is preferable that the transistor T2 has a threshold voltage set to be lower than that of the transistor T1.

The first resistive element RA11 is of the same structure as the transistor T2. That is, a p-type layer 60, which is the first conductivity type zone, is formed in the surface of the second conductivity type semiconductor substrate 30, and n+-type layers 61 and 62, which are the second conductivity type zones, are formed as mutually separated in the surface of the p-type layer 60. On an insulating film 63, there is formed an electrode 64 of polysilicon or the like to be disposed across the both n+-type layers 61 and 62 through the insulating film 63. Accordingly, the first resistive element RA11 of non-linear type and having a rectifying property is formed with the electrode 64 made as the gate G, the n+-type layer 62 as the drain D and the other n+-type layer 61 as the source S, the drain and gate being connected to each other through a conducting film 65 of Al or the like as shown in the drawing. The second resistive element RA12 is also of similar structure as the transistor T2. That is, a p-type layer 70, which is the first conductivity type zone, is formed in the second conductivity type semiconductor substrate 30, and n+-type layers 71 and 72, which are the second conductivity type zones, are formed as mutually separated in the p-type layer 70. Further, a thin n-type layer 73 is formed so as to extend across the separated n+-type layers 71 and 72 to render them to be normally ON (depletion) type. On the surface of an insulating film 74, an electrode 75 of polysilicon or the like is formed to ride across both n+-type layers 71 and 72 through the insulating film 74. Accordingly, the second resistive element RA12 acting as a high resistance is provided with the electrode 75 as the gate G, n+-type layer 72 as the drain D and the n+-type layer 71 as the source S, the gate and source being connected through a conducting film 76 of Al or the like as shown in the drawing. As shown in FIG. 8, further, the p-type layers 60 and 70 may be connected through a resistor to the source of the transistor T1 so as to stabilize the static potential.

In addition, the light receiving element 10' is formed on the semiconductor substrate 30 with an insulating film 33 interposed between them. That is, a conductive thin film electrode 310 consisting of Ni-Cr or the like material is formed on the insulating film 33. The first photoelectric conversion element D1 is provided by laminating thereon a first conductivity type (e.g., p-type) semiconductor layer 320 consisting of amorphous silicon or the like, semiconductor layer (carrying out the photoelectric conversion) 330 low in the concentration of the valency controlling impurities, and second conductivity (e.g., n-type) semiconductor layer 340 in the order described. Further, a desired number of the photoelectric conversion elements D2, D3 . . . are sequentially laminated in the thickness direction of the device, a transparent conducting electrode 350 of In$_2$O$_3$ or the like is formed on the last formed photoelectric conversion element, and the light receiving element 10' is thereby provided. The respective elements thus formed are mutually connected as shown in FIG. 7 by means of conductive thin films of Ni-Cr, Al or the like, while the connections between the light receiving element 10' and the other elements are made by removing the required parts of the insulating film 33 through an etching process or the like.

Figure 9:
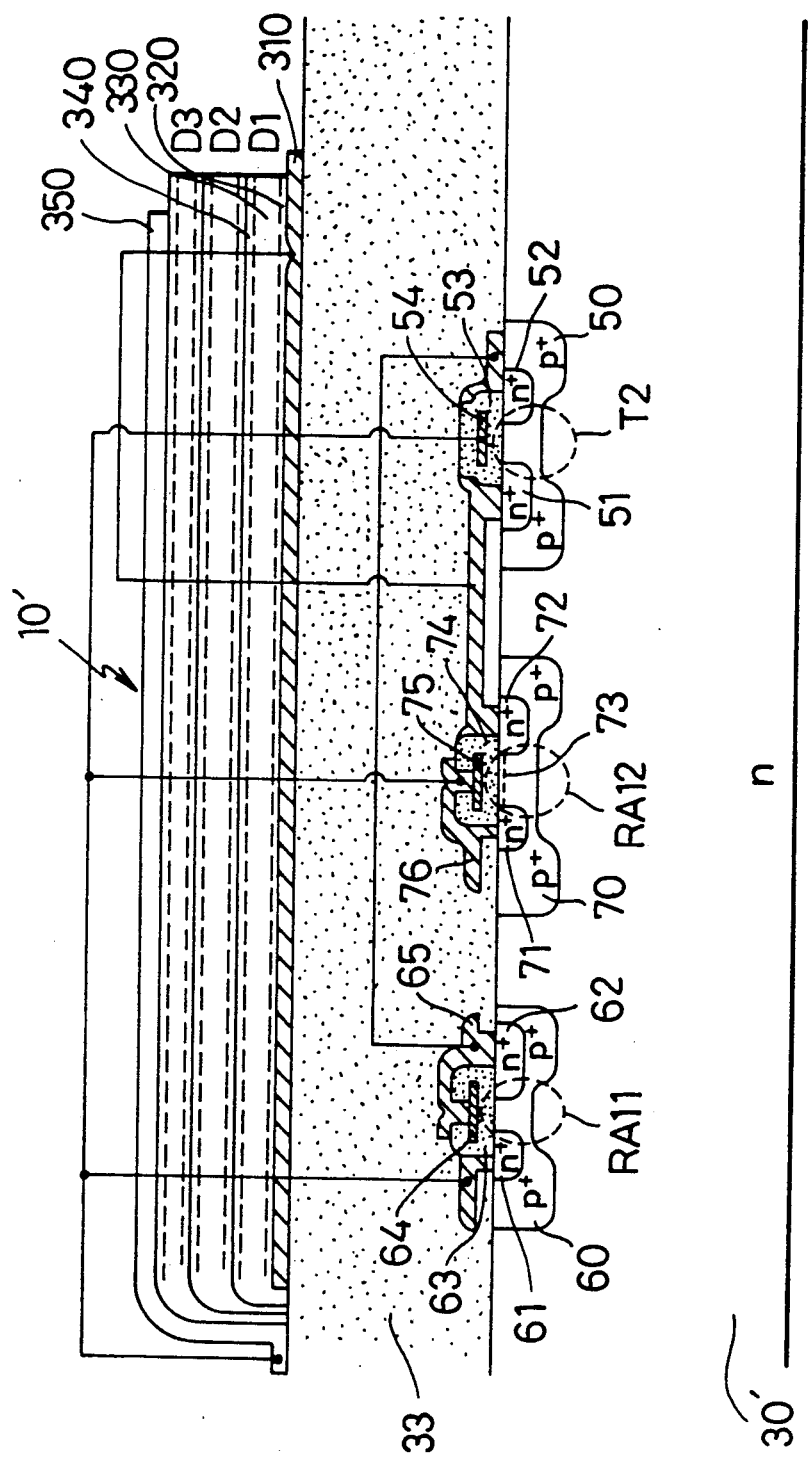
FIG. 9 shows a cross section of another embodiment of a switching device in which the semiconductor device according to the present invention is employed.

As shown in FIG. 9, the light receiving element 10' may also be provided as laminated on a semiconductor substrate 30' which is not provided with the transistor T1 but only with the control circuit DR1, that is, the circuit of the transistor T2 and first and second resistive elements RA11 and RA12. In the arrangement of FIG. 9, the same components as in the embodiment of FIG. 7 are denoted by the same reference numerals, and arrangement and operation thereof are the same as those in the embodiment of FIG. 7.

While in the embodiments of FIGS. 7 and 9 the transistor T2 has been referred to as being of normally OFF type, the same may be of normally ON type. In contrast to the embodiments referred to, it may also be possible to employ an arrangement in which the light receiving element and switching device are disposed in reversed relationship and molded integrally.

It should be appreciated that the switching device in the embodiments of FIGS. 7 and 9 is of a type in which the switching element is turned into a conductive state upon incidence of light and into a non-conducting state when the incident light is interrupted.

Figure 10:
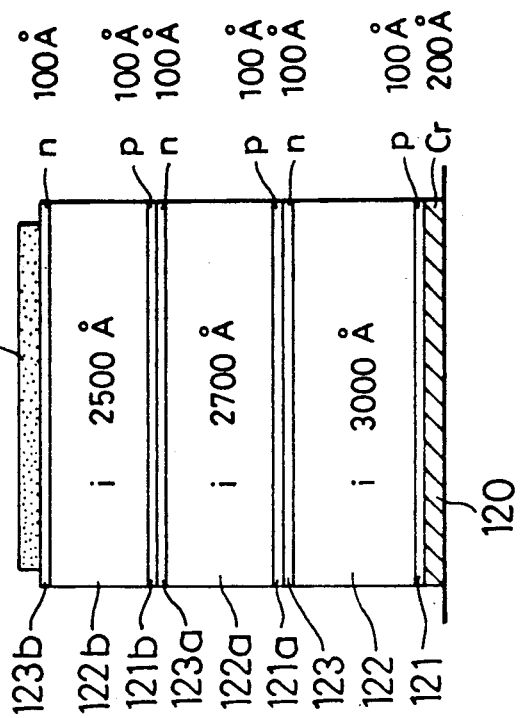
FIG. 10 shows a cross section of a three-layer tandem cell as another embodiment of the semiconductor device according to the present invention.

Referring to FIG. 10, there is shown an arrangement in which the semiconductor device according to the present invention is employed in a three layered tandem cell, in which a first set of layers is formed on a conductive thin film 120 made, e.g., of Ni-Cr by laminating a first conductivity type (e.g., p-type) layer 121, a semiconductor layer (e.g., of i-type) 122 for the photoelectric conversion and an opposite conductivity type (e.g., n-type) layer 123 in the order described and respectively in the thickness given in the drawing. Second and third sets of layers are further formed on the first layer by sequentially laminating layers 121a, 122a and 123a and 121b, 122b and 123b in the same order. A light transmitting conductive thin film 124 of In$_2$O$_3$ is then provided to cover the top surface of the third layer, and the three layered tandem cell is thereby provided.

Figure 11:
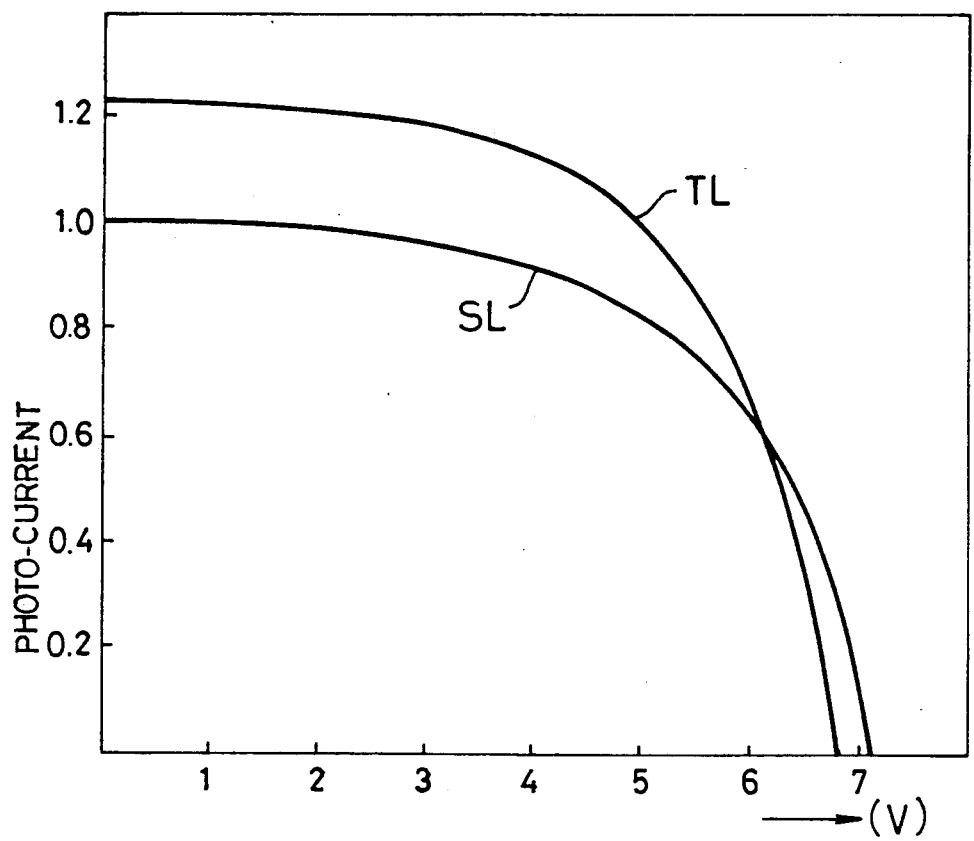
FIGS. 11 and 12 are diagrams showing characteristics of the cell of FIG. 10 in contrast to those of a single-layer cell.
Figure 12:
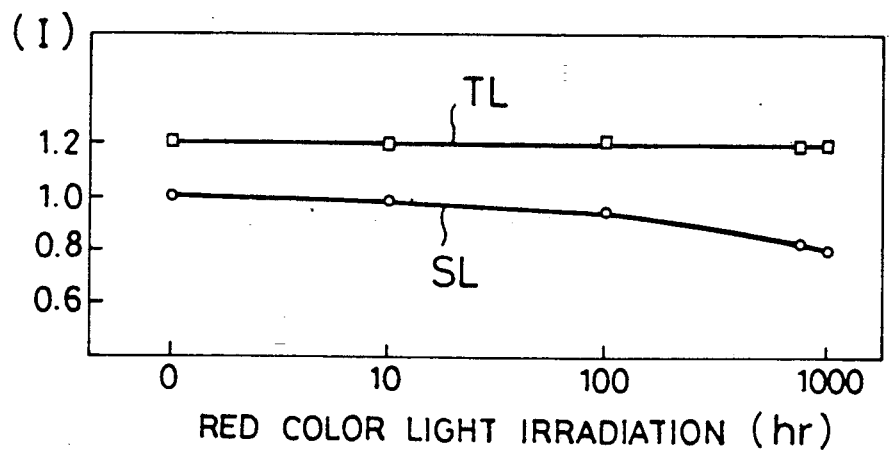

This three layered tandem cell according to the present embodiment has been subjected to a measurement of the photocurrent vs. voltage with respect to a red light of an LED in contrast to that of conventional single layered cell, through which it has been found that, as shown in FIG. 11, the photo-current of the three layered tandem cell, TL is improved by more than 20% as compared with the photo-current of the single layered cell, SL. Similarly, the cell has been subjected to a measurement of photo-induced degradation, according to which, whereas the single layered cell deteriorated in output current by about 20% after continuous irradiation of the red LED light for 1,000 hours, the three layered tandem cell according to the present invention has shown no deterioration, keeping the same level of output current as that obtained upon starting of the measurement, as shown in FIG. 12.

Figure 13:
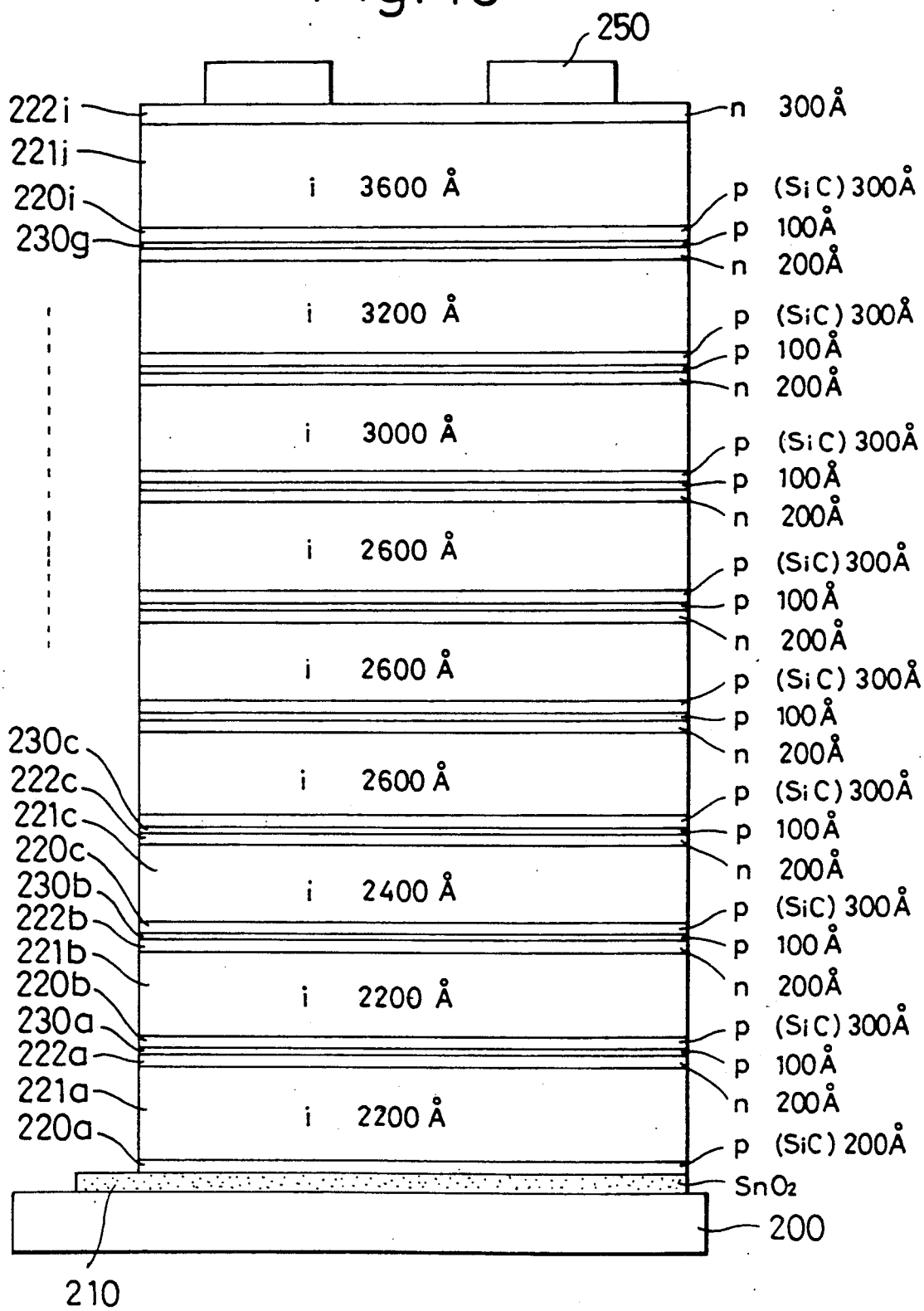
FIG. 13 shows a cross section of a further embodiment of a nine-layered tandem cell of the semiconductor device according to the present invention.

Referring to FIG. 13, further, there is shown still another embodiment of the semiconductor device according to the present invention and employed in a nine-layered tandem type cell, in which a light-transmitting and electrically conductive thin film 210 of SnO2 is formed on a transparent and electrically insulating substrate 200 made, e.g., of glass or the like, and a first tandem layer is formed on the thin film 210 by sequentially laminating, in the order described, a first conductivity type (e.g., p-type) layer 220a of a material low in light absorption such as SiC or the like, semiconductor layer 221a (e.g., of i-type) for the photoelectric conversion, and opposite conductivity type (e.g., n-type) layer 222a, respectively in such thicknesses as given in the drawing. Further on this first set of layers, a first conductivity type (e.g., p-type) intermediate layer 230a is laminated to be of a thickness shown in the drawing, and thereafter eight sets of the same semiconductor layers 220b, 221b and 222b; 220c, 221c and 222c; ... 220i 221i and 222i as the three layers of the foregoing first set of layers are sequentially laminated to form second through ninth sets of layers, respectively with each of further first conductivity type intermediate layers 230b, 230c, ... 230h interposed between them. Finally, on the topmost ninth tandem layer comprising the semiconductor layers 220i, 221i and 222i, a conductive thin film 250 of Ni is formed and the nine-layered tandem cell is thereby completed.

Figure 14:
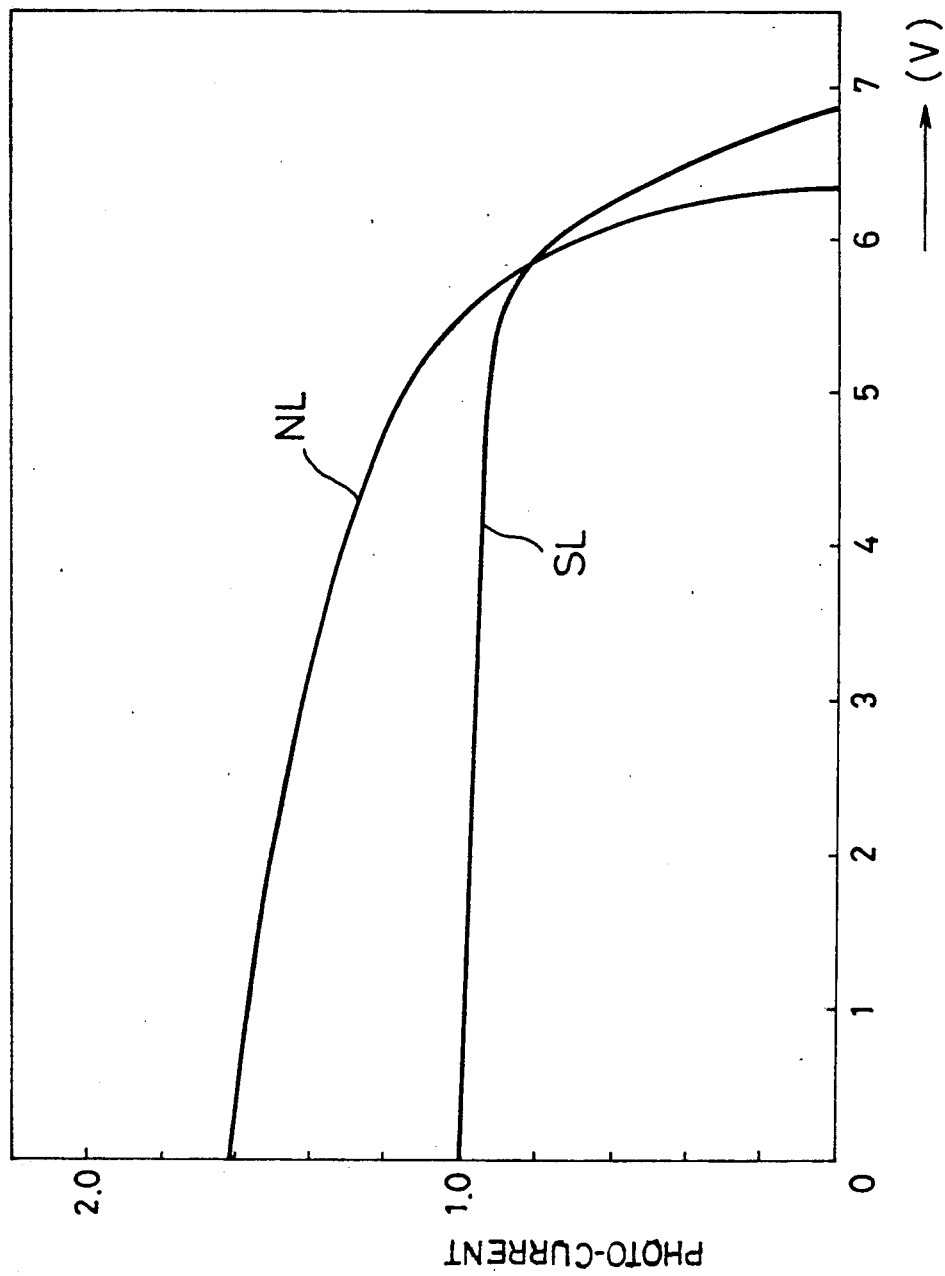
FIG. 14 is a characteristic diagram of the cell of FIG. 13 shown in comparison with characteristics of a single-layer cell.

The above nine-layered tandem cell according to the present embodiment has been also subjected to a measurement of the light absorption rate with respect to the red LED light, through which it has been found that the photo-current of this nine-layered tandem cell, NL has been improved by more than 60% as compared with that of the single layered tandem cell, SL, as shown in FIG. 14, and it has been considered possible that this photo-current could be further improved when the arrangement is optimized.

What is claimed is:

1. A thin film semiconductor photoelectric light to electricity conversion device which comprises a plurality of laminated photoelectric conversion elements each including a said semiconductor thin film having the relationship $L \leq 1/\alpha(\lambda)$ when incident light is of a wavelength $\lambda$, the semiconductor thin film has a light absorption coefficient $\alpha(\lambda)$ and a carrier collection length L.

2. The device according to claim 1 wherein said laminated photoelectric conversion elements satisfy a relationship of $L < d < nL$ when a total thickness of said semiconductor thin films of the laminated photoelectric conversion elements is d and the number of the laminated photoelectric conversion elements is n.

3. The device according to claim 1 wherein the number of said laminated photoelectric conversion elements is more than $1/\{\alpha(\lambda) \cdot L\}$.

4. The device according to claim 2 wherein the said semiconductor thin film of the m-th element ($1 < m \leq n$) from the side on which said light is incident said photoelectric conversion elements is of a film thickness tm such that $tm \leq L$.

5. The device according to claim 1 wherein said laminated photoelectric conversion elements are substantially equal to each other in the light volume absorbed in each of the elements.

6. The device according to claim 5 wherein the cumulative thickness Xm of said semiconductor thin films from the first one on the side of said incident light to the m-th one of said photoelectric conversion elements satisfies the formula $$Xm = d - \{1/\alpha(\lambda)\} \sin h^{-1} \cdot [\{1-(m/n)\} \sin h \cdot \alpha(\lambda) \cdot d].$$

7. The device according to claim 1 which forms a light receiving element for a switching device, said light receiving element providing said electric power to electrodes of a field effect transistor as a switching element of said switching device.

8. The device according to claim 7 wherein said laminated photoelectric conversion elements are of a number enough for providing an output voltage exceeding a threshold voltage of said field effect transistor.

9. The device according to claim 7 wherein said switching device includes a control circuit, the device being laminated on a common semiconductor substrate on which said control circuit is formed.

10. The device according to claim 7 which is provided on a common semiconductor substrate on which said field effect transistor is formed.

* * * * *